US008571469B2

(12) United States Patent
LaBerge

(10) Patent No.: US 8,571,469 B2
(45) Date of Patent: Oct. 29, 2013

(54) MEMS BASED MULTIBAND RECEIVER ARCHITECTURE

(75) Inventor: E. F. Charles LaBerge, Towson, MD (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 13/071,134

(22) Filed: Mar. 24, 2011

(65) Prior Publication Data

US 2011/0171918 A1    Jul. 14, 2011

Related U.S. Application Data

(62) Division of application No. 11/566,921, filed on Dec. 5, 2006, now Pat. No. 7,937,054.

(60) Provisional application No. 60/751,110, filed on Dec. 16, 2005.

(51) Int. Cl.
*H04B 7/14* (2006.01)
*H04B 7/185* (2006.01)
*H04M 1/00* (2006.01)

(52) U.S. Cl.
USPC .......................... 455/20; 455/550.1; 370/316

(58) Field of Classification Search
USPC ........ 455/424, 425, 456.5, 456.6, 561, 550.1, 455/575.1, 189.1, 188.1, 147, 334, 336, 455/340, 341, 83, 82, 552.1, 553.1, 307, 455/266, 13.3, 146, 73, 285, 302, 140, 303, 455/277.1, 20, 91, 207, 209; 375/316, 340, 375/350, 342, 349, 324, 328, 219; 333/186, 333/194, 193, 187, 203, 196; 370/316, 338
See application file for complete search history.

(56) References Cited

U.S. PATENT DOCUMENTS

| 4,081,769 | A | * | 3/1978 | Shreve | 333/195 |
| 4,262,269 | A | * | 4/1981 | Griffin et al. | 333/204 |
| 4,321,567 | A | * | 3/1982 | Sandy | 333/196 |
| 4,596,969 | A | * | 6/1986 | Jachowski | 333/203 |
| 4,701,727 | A | | 10/1987 | Wong | |
| 4,721,925 | A | * | 1/1988 | Farace et al. | 331/154 |

(Continued)

FOREIGN PATENT DOCUMENTS

| WO | 9533350 | 12/1995 |
| WO | 03036876 | 5/2003 |

OTHER PUBLICATIONS

Pucker, "Applicability of the JTRS Software Communication Architecture in Advanced MILSATCOM Terminals", "2003 IEEE Military Communications Conference", Oct. 2003, pp. 533-537, vol. 2, Publisher: IEEE.

(Continued)

*Primary Examiner* — Nay A Maung
*Assistant Examiner* — Cindy Trandai
(74) *Attorney, Agent, or Firm* — Fogg & Powers LLC

(57) ABSTRACT

A system to receive using MEMS elements is provided. The system includes means for receiving a broadband signal; means for selecting a superband of frequencies from the received broadband signal; means for selecting bands within the superband of frequencies, wherein the bands each have a center frequency that is offset from the other center frequencies; means for steering output from the means for selecting bands; and means for receiving the output from the means for steering output.

10 Claims, 8 Drawing Sheets

(56) References Cited

U.S. PATENT DOCUMENTS

| | | | |
|---|---|---|---|
| 5,013,979 A * | 5/1991 | Birleson | 342/375 |
| 5,870,063 A | 2/1999 | Cherrette et al. | |
| 6,041,245 A | 3/2000 | Mansour | |
| 6,049,702 A | 4/2000 | Tham | |
| 6,339,396 B1 * | 1/2002 | Mayersak | 342/357.34 |
| 6,566,786 B2 | 5/2003 | Nguyen | |
| 6,784,766 B2 | 8/2004 | Allison | |
| 6,963,758 B2 * | 11/2005 | Narahashi et al. | 455/561 |
| 6,995,658 B2 * | 2/2006 | Tustison et al. | 375/219 |
| 7,187,735 B2 * | 3/2007 | Kent et al. | 333/193 |
| 7,269,441 B2 | 9/2007 | Ella | |
| 7,636,554 B2 * | 12/2009 | Sugar et al. | 455/73 |
| 7,668,505 B2 * | 2/2010 | Vacanti et al. | 455/20 |
| 7,787,833 B2 * | 8/2010 | Gillette et al. | 455/91 |
| 7,831,210 B1 * | 11/2010 | Freeman et al. | 455/73 |
| 2001/0019575 A1 * | 9/2001 | Kohno et al. | 375/131 |
| 2001/0033119 A1 * | 10/2001 | Nguyen | 310/309 |
| 2002/0151281 A1 * | 10/2002 | Izadpanah et al. | 455/83 |
| 2003/0219035 A1 * | 11/2003 | Schmidt | 370/478 |
| 2004/0095210 A1 * | 5/2004 | Nguyen | 333/187 |
| 2004/0185795 A1 | 9/2004 | Shamsaifar | |
| 2004/0203552 A1 | 10/2004 | Horiuchi et al. | |
| 2004/0232523 A1 | 11/2004 | Shamsaifar et al. | |
| 2004/0258420 A1 * | 12/2004 | Sayyah | 398/183 |
| 2005/0107125 A1 | 5/2005 | Gilbert | |
| 2006/0057959 A1 | 3/2006 | Vacanti et al. | |
| 2006/0120730 A1 * | 6/2006 | Drentea | 398/201 |
| 2006/0135195 A1 * | 6/2006 | Leinonen et al. | 455/550.1 |
| 2006/0146861 A1 | 7/2006 | Maeda | |
| 2007/0096847 A1 | 5/2007 | Trutna, Jr. | |
| 2008/0069075 A1 | 3/2008 | Holl | |

OTHER PUBLICATIONS

Ratazzi, "Microelectromechanical Devices for Multimode Communication Systems", "Proceedings of the IEEE 2000 National Areospace and Electronics Conference", Oct. 2000, pp. 346-353, Publisher: IEEE.

Sarkar et al., "FR and mm-Wave SOP Module Platform using LCP and RF MEMS Technologies", "Microwave Symposium Digest", Jun. 6, 2004, pp. 567-570, vol. 2, Publisher: 2004 IEEE MTT-S International, Published in: Piscataway, NJ.

* cited by examiner

US 8,571,469 B2

MEMS BASED MULTIBAND RECEIVER ARCHITECTURE

CROSS-REFERENCE TO RELATED APPLICATIONS

This application is a divisional of U.S. patent application Ser. No. 11/566,921 filed on Dec. 5, 2006 (the '921 application) entitled "MEMS BASED MULTIBAND RECEIVER ARCHITECTURE", which claims the benefit of U.S. Provisional Application No. 60/751,110, filed on Dec. 16, 2005 (the '110 application) entitled "MEMS-BASED MULTIBAND MULTICHANNEL RECEIVER ARCHITECTURE". The '921 and '110 applications are incorporated herein by reference.

BACKGROUND

The next generation of military and civilian communications products will incorporate the ability to dynamically adjust their use of spectrum based on measurements of the installed environment. Such "cognitive" radios must be capable of operating on a wide range of different radio frequencies. At the same time, the ubiquitous nature of wireless communications is producing an environment where a single user desires to receive information from multiple independent sources, which, once again, may be operating in completely different spectral regions.

The US Department of Defense has recognized that it is desirable to have basic radio that can operate on multiple channels spaced over many separate frequency bands. The DoD has invested billions of dollars in the Joint Tactical Radio System (JTRS) to accomplish this goal. The JTRS radios are intended to operate over the range of 2 MHz (2,000,000 Hz) to 2 GHz (2,000,000,000 Hz). Depending on options, the JTRS radios may contain one, two, four, six, or more receive and transmit channels. Typical JTRS radios, such as those known as the Cluster 1 radios, occupy a volume of some 28,000 cubic centimeters ($cm^3$) and consume 100 watts of power. JTRS radios contain receiver hardware, transmitter hardware, and extensive software for waveform processing and link and network layer control. Prices for an individual JTRS radio may exceed $100,000.

The key to the JTRS program is the processing of the received waveforms by software controlled digital techniques. In particular, the JTRS architecture relies on conversion of the analog received signals to digital form at the soonest possible point in the radio architecture, followed by digital filtering and down conversion functions in either high-speed digital hardware or powerful digital signal processor ships. This requires high sample rate analog-to-digital converters, high-speed FPGAs, and powerful DSPs capable of billions of operations per second (GFLOPs/sec). In addition, the JTRS software architecture requires a powerful general purpose processor with a significant amount of memory. The net result is that multichannel JTRS units are sizable, relatively heavy, and power-hungry.

SUMMARY

The present application relates to a system to receive using MEMS elements. The system includes means for receiving a broadband signal; means for selecting a superband of frequencies from the received broadband signal; means for selecting bands within the superband of frequencies, wherein the bands each have a center frequency that is offset from the other center frequencies; means for steering output from the means for selecting bands; and means for receiving the output from the means for steering output

DRAWINGS

In accordance with common practice, the various described features are not drawn to scale but are drawn to emphasize features relevant to the present invention. Reference characters denote like elements throughout figures and text.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

Recent advances in micro-electromechanical systems (MEMS) technology now permit the monolithic construction of various filter structures and switch elements in tiny volumes. For example, typical MEMS technology permits filter structures as small as $100 \times 10^{-6}$ $cm^3$ and switch structures of half that size. The availability of such miniaturization opens new doors in receiver architectures which use MEMS availability of such miniaturization opens new doors in receiver architectures which use MEMS filtering in the analog domain to achieve much of the flexibility currently provided by digital receiver architectures at a tiny fraction of the volume, weight, and DC power consumption.

Figure 1:
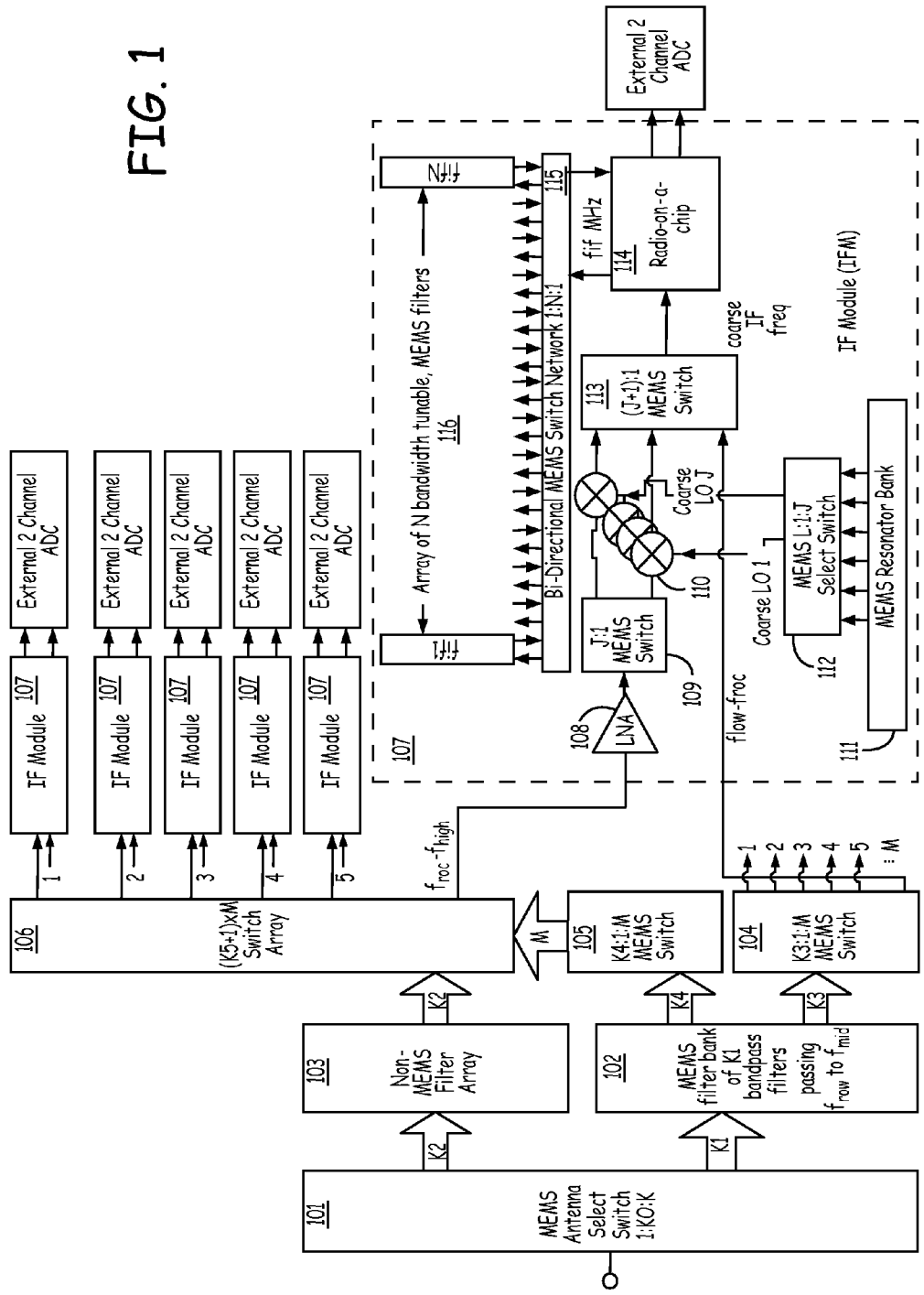
FIG. 1 is a block diagram of one embodiment of a receiver architecture for M independent channels.

FIG. 1 is a block diagram of one embodiment of a receiver architecture for M independent channels. The receiver architecture comprises a two-level MEMS 1:K0:K antenna-select switch 101, also referred to herein as "antenna-select switch 101," a MEMS filter bank 102, a non-MEMS filter array 103, and a plurality of intermediate frequency modules 107. The two-level MEMS 1:K0:K antenna-select switch 101 uses a two-level architecture to steer the single antenna input 15. Two levels are used to reduce the capacitive load for input frequencies above 1 GHz.

The MEMS filter bank 102 and non-MEMS filter array 103 are both communicatively coupled to receive output from the antenna-select switch 101. The MEMS filter bank 102 is logically grouped into two sets of filters consisting of K3 filters and K4 filters. The non-MEMS filter array 103 is logically grouped into one set of filters consisting of K2 filters. The plurality of intermediate frequency modules 107 are communicatively coupled to receive output from the filters in the MEMS filter bank 102 and the non-MEMS filter array 103. The MEMS filter bank 102 and the non-MEMS filter array 103 are communicatively coupled to the plurality of intermediate frequency module 107 by least one switching matrix. The switching matrix includes the MEMS switch 104, the MEMS switch 105 and the IF module select switch 106 shown in FIG. 1. In one implementation of this embodiment, the filters in the non-MEMS filter array 103 comprise tunable bandpass filters.

Each independent channel supported by the receiver architecture has at least one associated intermediate frequency module. The intermediate frequency modules 107 each comprise a low-noise amplifier 108, a MEMS switch 109, a plurality of mixers 110, a radio 114, a bi-directional MEMS switch network 115, a plurality of MEMS filters 116, a MEMS resonator bank 111, and MEMS switches 112 and 113. In one implementation of this embodiment, the radio 114 is a radio-on-a-chip device; therefore the radio 114 is also referred to herein as "radio-on-a-chip 114."

Within the intermediate frequency module 107, the MEMS switch 109 is communicatively coupled to an output of the low-noise amplifier 108. The plurality of mixers 110 are communicatively coupled to outputs of the MEMS switch 109. Only one of the mixers 110 is energized at any one time. The radio 114 is selectively coupled to receive input from at least one of the plurality of mixers 110 via the MEMS filter bank 113 and to provide output to the bi-directional MEMS switch network 115. The bi-directional MEMS switch network 115 communicatively couples an output of the radio 114 to a selected one of the plurality of MEMS filters 116 and communicatively couples an output of the selected one of the plurality of MEMS filters 116 back to the radio 114. The MEMS resonator bank 111 generates at least one coarse local oscillator signal selected by MEMS switch 112 for the selected mixer 110.

Figure 2:
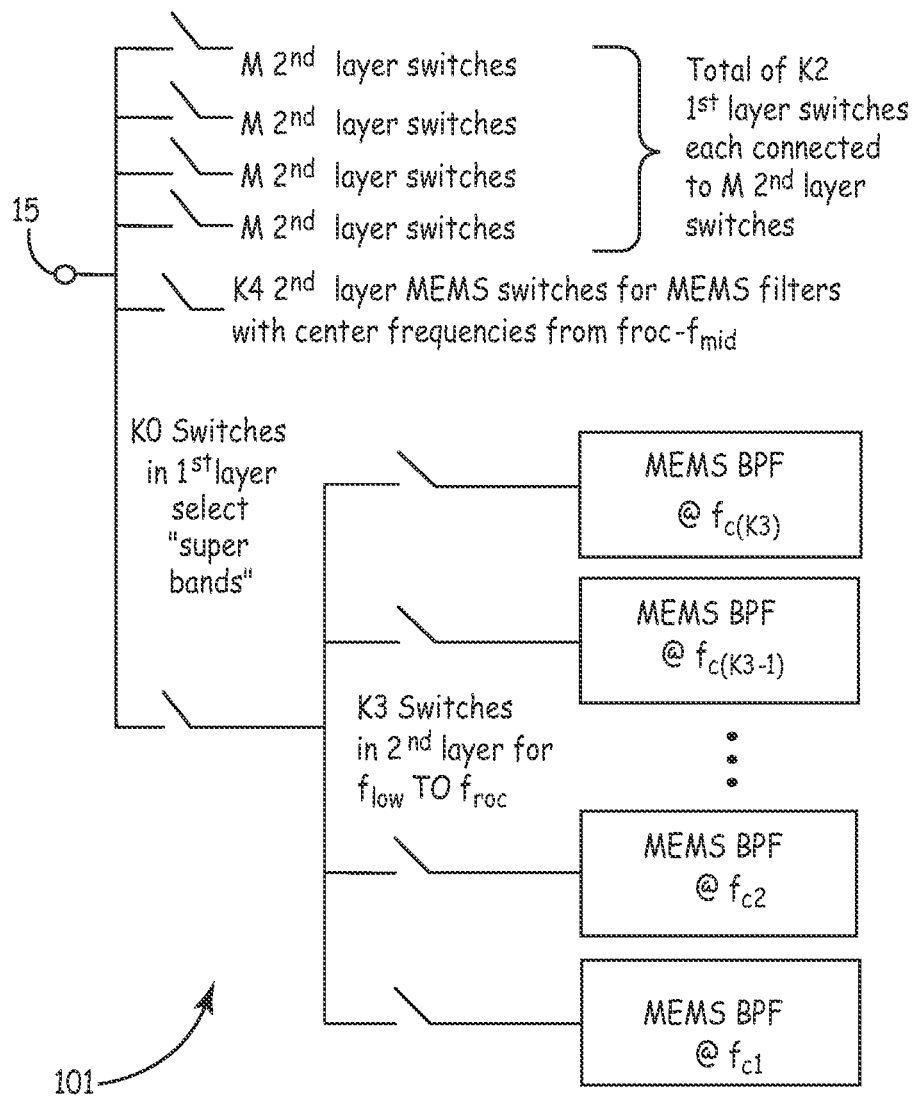
FIG. 2 is a block diagram of one embodiment of an antenna switch configuration.

FIG. 2 is a block diagram of one embodiment of an antenna switch configuration. As shown in FIG. 2, at the first level, K0 switches select one of K0 "super bands" of frequencies. At the second level, each first level switch feeds K2, K3, or K4 additional switches as shown in FIG. 1, depending on the selected frequency band. In the configuration depicted, the total number of antenna switch outputs is given by K1+K2 where K1=K3+K4. Each of the K3 or K4 second-level switches feeds a MEMS bandpass filter with fixed center frequency. In a one implementation, the center frequencies may be spaced in a manner that makes it unnecessary to individually tune filters to an exact center frequency. The total number of switches in antenna-select switch 101 is the sum of K0, K2, K3 and K4. In one implementation, these switches may all be integrated into a single unit with the MEMS filters. In other implementations, various partitions of switches and filters may be integrated, as appropriate for the system application.

Figure 3A:
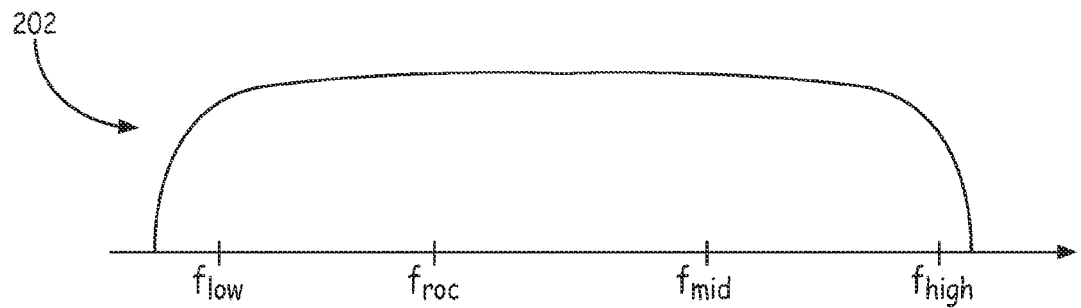
FIGS. 3A-3C show an exemplary spectrum of the signals that are selected and steered by an antenna-select switch over a wide frequency range.
Figure 3B:
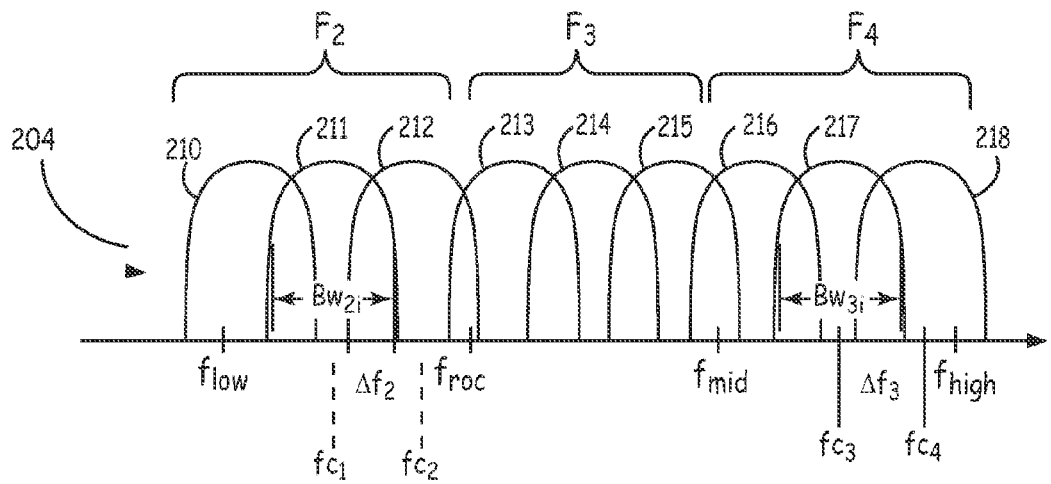
Figure 3C:
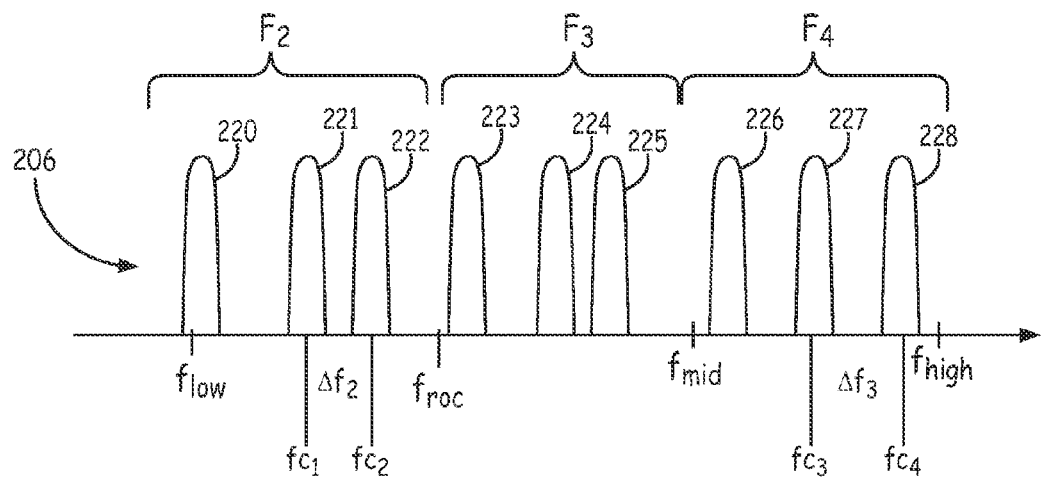

FIGS. 3A-3C show an exemplary spectrum of the signals that are selected and steered by an antenna-select switch 101 over a wide frequency range. FIG. 3A shows the total available spectral band than can be serviced by the architecture. This is the spectral band of the received broadband radio frequency signal 202 that is input to the single antenna input 15. The broadband radio frequency signal 202, also referred to herein as "broadband signal 202," extends from about $f_{low}$ to about $f_{high}$. FIG. 3B shows the set of spectral bands represented generally by the numeral 204 that are passed by the exemplary K2 non-MEMS filters in the non-MEMS filter array 103 and that are passed by the exemplary K3 and K4 filters in the MEMS filter bank 102. The terms "spectral band," "band" and "subband" are used interchangeably in this document. FIG. 3C shows the set of spectral bands of interest represented generally by the numeral 206 that are transmitted by the filters in the non-MEMS filter array 103 and in the MEMS filter bank 102. Each spectral band 210-218 in the set of spectral bands 204 is associated with one or more of the spectral bands of interest 220-228 in the set of spectral bands of interest 206. The spectral bands of interest 220-228 are also referred to herein as "center frequency bands 220-228." FIG. 3B shows an exemplary set of subbands 210-218 which are representative of the K2+K3+K4 filters in the non-MEMS filter array 103 and MEMS filter bank 102. In most implementations of this embodiment, the values of K2+K3+K4 are much greater than 9.

As shown in FIGS. 3B and 3C, the spectrum is segmented into a lower frequency superband F2, an intermediate frequency superband F3, and a higher frequency superband F4. Superband F2 extends from $f_{low}$ to $f_{roc}$, superband F3 extends from $f_{roc}$ to $f_{mid}$, and superband F4 extends from $f_{mid}$ to $f_{high}$. The boundary between the superbands F2 and F3 is determined by the maximum input frequency $f_{roc}$ of the radio-on-a-chip 114. In an early implementation, $f_{roc}$=450 MHz, but this value may vary based on the specific technology and manufacturer of the radio-on-a-chip device. The boundary between the superbands F3 and F4 is determined by the maximum practical operating frequency of the MEMS filters contained in the MEMS filter bank 102. In an early implementation, $f_{low}$=20 MHz and $f_{mid}$=900 MHz. The value of $f_{mid}$ is expected to grow to between 2 GHz and 3 GHz, or higher, as MEMS technology advances.

The lower frequencies of superband F2 are selected by MEMS antenna select switch 101 and steered toward the MEMS filter array 102. The superband F2 includes exemplary bands 210, 211 and 212. The bands 210, 211 and 212 include a respective center frequency band 220, 221, and 222 (FIG. 3C). The respective center frequency bands 220, 221, and 222 represent the signals of interest, and may or may not overlap, depending on the physical environment. In general, the frequency bands 220, 221, and 222 will not overlap, and will fall in the pass bands of different MEMS filters in superband F2.

The MEMS filters in the MEMS filter bank 102 have a bandwidth $BW_{2i}$ and a central frequency $f_{ci}$ centered within the bandwidth. The bandwidth of each MEMS filter overlaps a portion of the bandwidth of an adjacent MEMS filter. As shown in FIG. 3B, the bandwidth of the band 211 passed by the MEMS filters is indicated as $BW_{2i}$ and the difference between the central frequency $f_{c1}$ of the peak of band 211 and the central frequency $f_{c2}$ of the peak of band 212 is shown as $\Delta f_{2i}$.

Similarly, the MEMS filters 213, 214, 215, in the MEMS filter bank that service frequencies in the superband F3 have fixed center frequencies and bandwidths that overlap. The K4 filters within the MEMS filter array 103 are useful if MEMS filter technology is applicable beyond the frequency range in which the radio 114 is operable. If, on the other hand, the radio 114 is operable over a wider range than the MEMS filters, it is possible for K4=0. In this case, K1=K3, and only superbands F2 and F4 exist.

Likewise, the bandwidth of the band 216, 217, 218 passed by the tunable bandpass filters in the non-MEMS filter array 103 is indicated as $BW_{3i}$ and the difference between the central frequency $f_{c3}$ of the peak of band 217 and the central frequency $f_{c4}$ of the peak of band 218 is shown as $\Delta f_3$.

In one embodiment of this invention, the difference in frequency, such as $\Delta f_3 = f_{c4} - f_{c3}$, between the central frequency $f_{ci}$ of adjacent MEMS or non-MEMS filters is less than half of the bandwidth BW of the adjacent MEMS filters. In other embodiments, the frequency bands of interest may be widely separated, and some of the MEMS or non-MEMS filters may not overlap their neighboring filters.

The non-MEMS filter array 103 includes the K2 non-MEMS filters to pass the upper frequencies of the broadband signal 202. In one implementation of this embodiment shown in FIG. 1, the non-MEMS filter array 103 includes filters that pass bands 216, 217, 218 to cover to the frequency range F4 outside of the bandpass region encompassed by MEMS technology.

The desired frequencies of superband F2 are selected by the K3 filters in the MEMS filter bank 102 and are steered toward the MEMS switch 104, also referred to herein as "K3:1:M MEMS switch 104." The MEMS switch 104 comprises a K3:1 MEMS switch followed by a 1:M switch. The MEMS switch 104 selects and steers the intermediate frequencies of the superband F2 directly to the MEMS switch 113 within the intermediate frequency module 107 for input to the radio-on-a-chip 114.

The superband F2 includes exemplary bands 210, 211 and 212. The bands 210, 211 and 212 include a respective center frequency bands of interest 220, 221, and 222 (FIG. 3C). Only one switch pair in the MEMS switch 102 and MEMS switch 104 passes a signal within the bands 220. Only one switch pair in the MEMS switch 102 and MEMS switch 104 passes a signal within the band 221 and only one switch pair in the MEMS switch 102 and MEMS switch 104 passes a signal within the band 222. In another implementation of this embodiment, the receiver architecture includes redundant switches in either MEMS switch 102 or MEMS switch 104, or both, which pass each of the bands 210, 211 and 212 in the event that one of the primary switches fails.

Similarly, the mid-range superband F3 includes exemplary bands 213, 214 and 215. The MEMS switch 105, also referred to herein as "K4:1:M MEMS switch 105" comprises a K4:1 MEMS switch followed by a 1:M switch. The MEMS switch 105 selects and steers the received broadband signal 202 in the superband F3 that are input from the MEMS filter bank 102 and outputs them to the IF module select switch 106. As with superband F2, the bands 213, 214 and 215 include a respective center frequency bands of interest 223, 224, and 225 (FIG. 3C). Only one switch pair in the MEMS switch 102 and MEMS switch 105 passes a signal within the bands 223. Only one switch pair in the MEMS switch 102 and MEMS switch 105 passes a signal within the band 224 and only one switch pair in the MEMS switch 102 and MEMS switch 105 passes a signal within the band 225. In another implementation of this embodiment, the receiver architecture includes redundant switches in either MEMS switch 102 or MEMS switch 105, or both, which pass each of the bands 213, 214 and 215 in the event that one of the primary switches fails.

The higher frequencies of superband F4 are selected by the appropriate switches in the MEMS antenna select switch 101 and steered toward the MEMS IF Module Select switch 106. The MEMS switch 105 selects and steers the received signals from superbands F3 and F4 MEMS filter bank 102 and the non-MEMS filter band 103 and outputs them to the IF modules selected for each signal of interest.

One potential configuration of the IF module select switch 106 comprises a bank of (K5+1):1 MEMS switches. In one implementation of this embodiment, there are a series of M arrays with K5 filters in each array. Each of the M filter arrays can independently serve a single intermediate frequency module 107. In this particular implementation, the values of K2 and K5 are related by K5=M×K2 but other configurations may be acceptable. The K5-element filter array in the IF module select switch 106 selects a frequency band from either superband F3 or from the superband F4 for input to the low noise amplifier 108 within the intermediate frequency module 107.

The receiver architecture includes a single intermediate frequency module 107 for each independent channel. Each of the M intermediate frequency modules 107 accept radio frequency inputs from the any of the subbands 210, 211 and 212 in the superband F2 via MEMS switch 104, from any of the subbands 213, 214, and 215 in superband F3 via IF module select switch 106, or from any of the subbands 216, 217 and 218 in the superband F4 via IF module select switch 106. In one preferred implementation, the intermediate frequency module 107 provides baseband in-phase (I) and quadrature (Q) outputs from the radio-on-a-chip 114, but implementations that output a single IF signal at frequency $f_{if}$ are possible, and may be preferable in some implementations.

The low noise amplifier 108 in each intermediate frequency module 107 includes a broadband low noise amplifier circuit that provides gain and assists in setting the overall receiver noise figure. The input to the LNA is the selected band from $f_{roc} - f_{high}$, which encompasses superbands F3 and F4, as selected by the IF module select switch 106. Frequencies in superband F2, that is, those frequencies that fall within the operational range of the radio-on-a-chip 114, are selected by the MEMS switch 113 from the output of 104 and enter the radio-on-a-chip 114 directly.

For selected frequencies in the superbands F3 and F4, the output of the low noise amplifier 108 passes through a J:1 MEMS switch 109 to select one of J parallel mixers 110. The switch 109 output feeds J parallel mixers 110. Only a single mixer, however, is energized at one time. In one implementation of this embodiment, J=2 mixers 110 are implemented to cover the range from 20 MHz to $f_1$=6 GHz. Narrower ranges of frequencies may obtain adequate performance with J=1, while wider ranges or different radio performance requirements, may dictate that J>2.

The coarse local oscillator signal for the mixers 110 is generated by a parallel array of MEMS resonators in the MEMS resonator bank 111. The outputs from the MEMS resonator bank 111 span the range from approximately twice $f_{roc}$ to $f_1$, and are widely spaced at approximately 80% of $f_{roc}$. In one implementation of this embodiment, a total of L distinct resonator frequencies are expected.

In one implementation of this embodiment, the MEMS resonator bank 111 is associated with filters and switch arrays such as MEMS switch 112, also referred to herein as "MEMS L:1:J select switch 112." The MEMS switch 112 selects the desired output of the resonator bank and steers it to the selected one of J mixers. One exemplary arrangement for MEMS switch 112 is an L:1 switch followed by a 1:J switch.

The output of the MEMS switch 113 is a first intermediate frequency that lies within the range $f_{low}$ to $f_{roc}$. The MEMS switch 113, also referred to herein as "(J+1):1 MEMS switch 113," selects a single output corresponding to the selected mixer or the output from switch 104. This output will correspond to the output of one of the spectral bands 210 through 218. Each IF module 107 will therefore receive one or more signals of interest 220 through 228. Additional selection between closely-spaced signals of interest will be performed in the tunable MEMS filter array 116 discussed below.

The radio-on-a-chip 114, also referred to herein as radio 114, of the receiver architecture contains amplifier(s), mixer(s), the gain control, precision synthesizer(s) and switching circuitry necessary to a) convert the input frequency from $f_{low}$ to $f_{roc}$ (i.e., the frequencies in the F2 superband) to the selected second IF frequency, fif; and, b) convert, amplify or otherwise process the filtered signal, centered at fif, to either an IF output or a baseband I and Q output. In one early implementation, the radio-on-a-chip function operates from $f_{low}$=20 MHz to $f_{roc}$=450 MHz, with a fixed IF of 40 MHz and baseband I and Q outputs. Other input frequencies and fixed IF frequencies are possible.

The MEMS switch network 115, also referred to herein as "bi-directional MEMS switch network 1:N:1 115," takes the IF output signal from the radio-on-a-chip 114 and selects one of N bandwidth-tunable or fixed bandwidth MEMS filters in the array of N bandwidth tunable MEMS filters 116. These N filters provide a range of selectable and controllable bandwidths for the IF signal. The output of the selected filter in the array of N bandwidth tunable MEMS filters 116 is reselected by the N:1 portion of the MEMS switch network 115 for input back into the radio-on-a-chip 114 for additional amplification and/or down conversion. The MEMS filters in the array of N bandwidth tunable MEMS filters 116 set the IF bandwidth of this architecture.

The receiver architecture described here capitalizes on the strength of MEMS technology while accommodating its weaknesses. The architecture is inherently scalable, small in volume, and accommodates inaccuracies in the center frequency of the MEMS devices while using open-loop MEMS resonators in the initial local oscillator stage.

The architecture of FIG. 1 is scaleable in terms of both inputs and outputs without additional technology development effort. "A" additional antenna inputs can be accommodated as shown in FIG. 2 by means of an A:1 MEMS switch arrangement that feeds the single antenna input 15. Such a MEMS switch is configured identically to the post-filter selection switches of FIG. 1. In another implementation of this embodiment, individual antennas are connected directly to the outputs of the K0 first level switches in shown in FIG. 1. Receive channels can be concatenated by expanding the second-level antenna-select switch dimension K2, adding an additional filter array(s), increasing the number of IF Modules, M, and adjusting the dimensions of the various switches as appropriate.

This architecture supports the monolithic integration of MEMS filters and switches. For example, using current technology, 500 switches and 200 filters could be integrated in a volume of approximately 0.033 cm$^3$. The combination of the architecture, the selected MEMS switch and filter technologies, the use of the radio-on-a-chip as an analog processing engine for IF functions, permits one implementation to package six receive channels in a volume of approximately 30 cm$^3$. In one implementation of this embodiment, independent filter paths within the receiver comprise a plurality of switches thereby providing redundancy. This redundancy provides a backup path in the event that one of the switches in one path fails. In another implementation of this embodiment, the 500 switches and 200 filters are partitioned into multiple integrated chips to meet specific design goals of specific radio applications.

One issue with current MEMS technologies for both filters and resonators is a relative inability to control the exact center frequency of the device due to manufacturing process limitations. This architecture accommodates inaccuracies of +/−0.5% without any necessity to electrically tune the MEMs devices that comprise the switches and/or filter arrays. This +/−0.5% range is orders of magnitude larger than typical crystal oscillators (10-100 ppm). Over an exemplary 0.9 GHz MEMS operating frequency range used in one instantiation of the architecture, the +/−0.5% inaccuracy amounts to approximately 5 MHz frequency inaccuracy. The architecture accommodates this by designing in overlap between adjacent preselect filters as shown in FIG. 3B between adjacent subbands, e.g., the overlap between subband 211 and subband 212. While the overlap between filters increases the number of filters and switches, it eliminates the need for relatively high control voltages necessary to tune the center frequency of the MEMS filters, and thereby reduces both power consumption and receiver volume.

To avoid the necessity for relatively high-power synthesizers in the above 1 GHz range, this architecture is designed to use open-loop MEMs resonators for its initial local oscillator stage. Inaccuracies in the MEMs resonator frequency of +/−0.5% (5000 ppm) can be accommodated by the down conversion scheme through the use of the precision integrated synthesizer functions assumed for the radio-on-a-chip (ROC) that is the basis of the IF module analog signal processing.

The plurality of radios 114 associated with respective ones of the plurality of intermediate frequency modules 107 are operable over a bandwidth range, such as the relatively wide bandwidth range covered by the spectral band of the received broadband radio frequency signal 202. In operation, a receiver configured with the receiver architecture of FIG. 1 is controlled, at least in part, by a controller that adjusts the operating frequency of each intermediate frequency module 107 based on the frequencies of interest 220 to 228 and the operating frequencies of others of the intermediate frequency modules 107 within the bandwidth range. In one implementation of this embodiment, the plurality of radios 114 are operable over the bandwidth range from about 20 MHz to about 450 MHz. In another implementation of this embodiment, the plurality of radios 114 are operable over the bandwidth range from about 20 MHz to about 6000 MHz.

Figure 4:
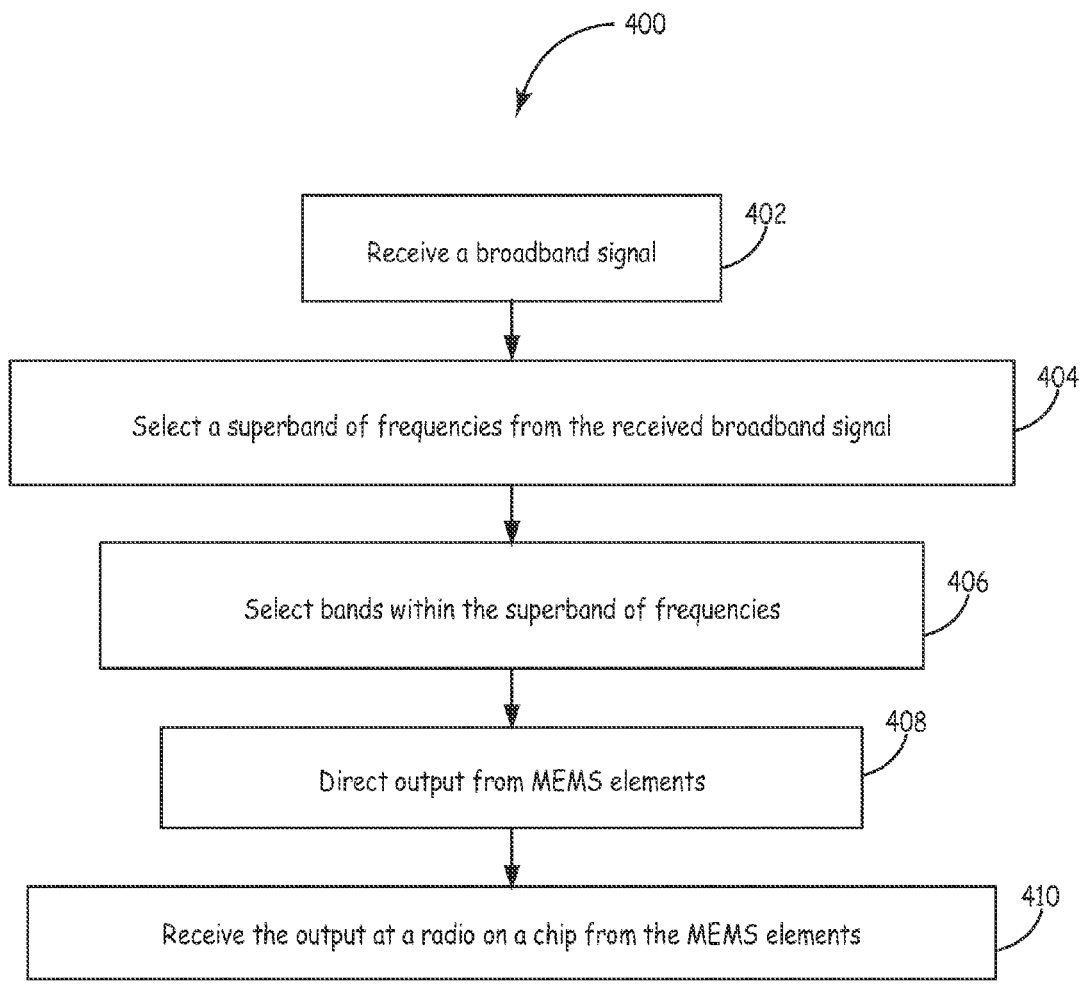
FIG. 4 is a flow diagram of one embodiment of a method to receive.

FIG. 4 is a flow diagram of one embodiment of a method 400 to receive. The embodiment of method 400 is described as being implemented using the receiver architecture for M independent channels of FIG. 1 to receive a signals within the frequency range shown in FIGS. 3A-3C.

At block 402, a broadband signal is received. In one implementation of this embodiment, a receiver having a receiver architecture of FIG. 1 receives a broadband signal 202 (FIG. 3A). At block 404, a superband of frequencies is selected from the received broadband signal. In one implementation of this embodiment, the superband F4 (FIG. 3B) is selected from the broadband signal 202 by the MEMS switch 101 and the MEMS filter bank 102.

In another implementation of this embodiment, the superband F2 is selected from the broadband signal 202 by the MEMS switch 101. In yet another implementation of this embodiment, the superband F3 (FIG. 3B) is selected from the broadband signal 202 by the MEMS switch 101 and the MEMS filter bank 102.

At block 406, a band is selected within the superband of frequencies. In one implementation of this embodiment, the band 217 is selected from the superband F4 by the MEMS switch 105 and by the IF module select switch 106. In another implementation of this embodiment, the band 211 is selected from the superband F2 by the non-MEMS filter array 103 and the IF module select switch 106. In yet another implementation of this embodiment, the band 214 is selected from the superband F3 by the MEMS switch 104.

At block 408, output is directed from MEMS elements. In one implementation of this embodiment, the MEMS elements are MEMS switches 113 that output a portion of the signal 202 to a radio-on-a-chip 114 in the intermediate frequency module 107.

At block 410, a radio-on-a-chip receives the output from the MEMS element. In one implementation of this embodiment, the radio-on-a-chip in a intermediate frequency module 107 that is associated with a channel supported by the receiver architecture receives the signal at the frequency of the channel from the MEMS switch 113.

Figure 5:
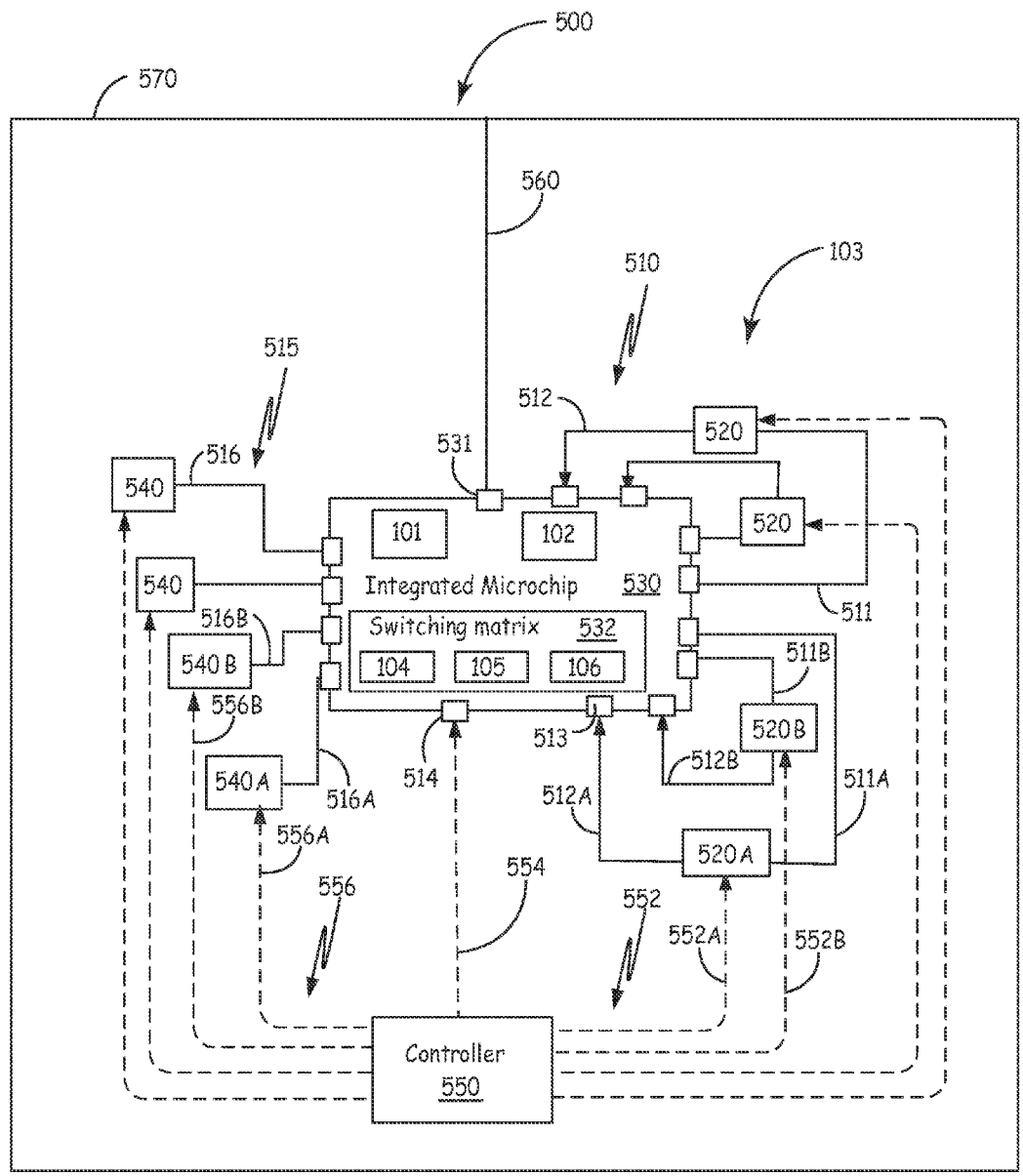
FIG. 5 is a receiving apparatus configured according to a receiver architecture for M independent channels.

FIG. 5 is a receiving apparatus 500 configured according to the receiver architecture for M independent channels as described above with reference to FIG. 1. The receiving apparatus 500 is part of a receiver or a transceiver. The receiving apparatus 500 includes a chip carrier 570 that supports at least one integrated micro-chip 530, tunable bandpass filters 520, intermediate frequency modules 540, sets of radio frequency transmission lines 510 and 515, a controller 550 and sets of trace lines 552 and 556. The tunable bandpass filters 520 are similar in function to the filters in the non-MEMS filter array 103 shown in the receiver architecture of FIG. 1. The intermediate frequency modules 540 are similar in structure and function to the intermediate frequency modules 107 shown in the receiver architecture of FIG. 1. The controller is communicatively coupled to control the two-level MEMS antenna-select switch 101, the MEMS filter bank 102, the non-MEMS filter array 103 and the plurality of intermediate frequency modules 540 so that the plurality of radios 114 (FIG. 1) associated with respective ones of the plurality of intermediate frequency modules 540 are operable over a wide bandwidth range. The controller 550 adjusts the operating frequency of each intermediate frequency module 540 based on the selected frequencies of interest 220 to 228 and the operating frequencies of others of the intermediate frequency modules 540 within the wide bandwidth range.

Only one of the integrated micro-chips 530 in the receiving apparatus 500 is shown in FIG. 5 to simplify the drawing. The discussion relative to FIG. 5 is applicable to each of the integrated micro-chips in the receiving apparatus 500. Each of the integrated micro-chips 530 include: antenna-select switches; MEMS pre-selection filters communicatively coupled to the antenna-select switches to send and receive signals in filtered-selected bandwidth regions; and switches to distribute the signals in each filtered-selected bandwidth region to an associated intermediate frequency module 540. Specifically, the integrated micro-chip 530, as shown in FIG. 5, includes the antenna-select switch 101, MEMS filter bank 102, a switching matrix 532, an antenna input interface 531, a controller interface 514 and filter interfaces 513. The switching matrix 532 includes the MEMS switch 104, the MEMS switch 105 and the IF module select switch 106 as shown in FIG. 1. Partitions of the switches and filters into multiple integrated chips to meet specific design goals of specific radio applications are also possible as is understandable based on the description related to FIG. 5.

The antenna input 560 receives broadband radio frequency signals, such as broadband signal 202 described above with reference to FIG. 3A, from an antenna (not shown). The antenna input interface 531 couples the broadband radio frequency signals from the antenna input 560 to the antenna-select switch 101.

The sets of radio frequency transmission lines 510 and 515 communicatively couple the integrated micro-chip 530 with the tunable bandpass filters 520 and the intermediate frequency modules 540, respectively. The radio frequency transmission lines 510 include radio frequency transmission lines represented generally by the numeral 511 that couple radio frequency signals from the integrated micro-chip 530 via filter interfaces represented generally by the numeral 513 to the tunable bandpass filters 520 and radio frequency transmission lines represented generally by the numeral 512 that couple the filtered radio frequency signals from the tunable bandpass filter 520 to each integrated micro-chip 530 via filter interfaces 513.

A first portion of the broadband radio frequency signal is selected by the antenna-select switch 101 and sent to the tunable bandpass filters 520 for filtering into bands prior to distribution to the associated intermediate frequency module 540 by the integrated micro-chip 530. A second portion of the radio frequency signal is selected by the antenna-select switch 101 and is steered and filtered by MEMS switches and MEMS filters within the integrated micro-chip 530 prior to distribution to the associated intermediate frequency module 540.

An exemplary operation of the receiving apparatus 500 is now described in detail with reference to the broadband signal 202, superbands F2, F3 and F4, subbands 210-218 and center frequency bands 220-222 of FIGS. 3A-3C. The switches in the antenna-select switch 101 separate the broadband radio frequency signal 202 into a lower bandwidth region that includes superband F2 (FIG. 3B) and into a higher bandwidth region that includes superbands F3 and F4 (FIG. 3B). The switches in the antenna-select switch 101 output signals within the superband F2 to the tunable bandpass filters 520 and signals within the superbands F3 and F4 to the MEMS filter bank 102.

The filters in MEMS filter bank 102 separate the signals within the higher bandwidth region into the constituent elements of the two superbands F2 and F3. The signals contained within the spectral bands 210, 211, 212 within the superband F2 are output from the MEMS filter bank 102 to the MEMS switch 104 and from there via the filter interfaces 513 to the radio frequency transmission lines represented generally by the numeral 516 for distribution to the MEMS switch 113 within the selected intermediate frequency module 540. The signals 213, 214, 215 within the superband F3 are output from the MEMS filter bank 102 to the MEMS switch 105 and directed therefrom to the MEMS switch 106, and are directed from the MEMS switch 106 via the filter interfaces 513 to the radio frequency transmission lines 516 for distribution to the selected intermediate frequency module 540, where they form the input to the LNA 108. Likewise, the signals within the bands 216-218 of superband F4 are directed from the MEMS switch 106 via the filter interfaces 513 to the radio frequency transmission lines 516 for distribution to the selected intermediate frequency module 540, where they form the input to the LNA 108. Each intermediate frequency module receives the input of a single one of the multiplicity of MEMS and non-MEMS filters represented by 102 and 103.

The signals within the superband F4 that are output from the switches in the antenna-select switch 101 is directed to the tunable bandpass filters 520, which form the non-MEMS filter array 103 of FIG. 1. The signals within the separate center frequency bands 226-228 are output from respective ones of the tunable bandpass filters 520 and are input to the MEMS switch 106 via radio frequency transmission lines 512 and interfaces 513. The MEMS switch 106 directs the signals within the center frequency bands 220-222 to the associated intermediate frequency module 540.

In one implementation of this embodiment, the integrated micro-chip 530 couples the signal within the selected bandwidth region, such as band 217 of FIG. 3B, of received broadband radio frequency signals 202 (FIG. 3A) to a first tunable bandpass filter 520A via an associated first radio frequency transmission line 511A. Then the first tunable bandpass filter 520A couples the signal within the filtered band, such as a single having a frequency $f_{c3}$ (FIG. 3C) to the integrated micro-chip 530 via the first radio frequency transmission line 512A. Likewise, in such an implementation, the integrated micro-chip 530 couples the signal within the selected bandwidth region, such as band 218 of FIG. 3B, of received broadband radio frequency signal 202 (FIG. 3A) to a second tunable bandpass filter 520B via an associated second radio frequency transmission line 511B. Then the second tunable bandpass filter 520B couples the signal within the filtered band, such as a single having a frequency $f_{c4}$ (FIG. 3C), to the integrated micro-chip 530 via the second radio frequency transmission line 512B. In this manner each bandpass filter 520 is coupled to an associated radio frequency transmission line 510.

The integrated micro-chip 530 outputs signals from each filtered selected bandwidth region to an associated one of the plurality of intermediate frequency modules 540 via the radio frequency transmission lines 516 of the set of radio frequency transmission lines 515. To continue the exemplary case, the signal in filtered band 227 having the frequency $f_{c3}$ is coupled to the intermediate frequency module 540A via radio frequency transmission line 516A and the signal in the band 228 having the frequency $f_{c4}$ is coupled to the intermediate frequency module 540B via radio frequency transmission line 516B. In this manner each intermediate frequency module 540 is coupled to an associated radio frequency transmission line 510 and the integrated micro-chip 530 outputs signals within the M filtered selected bandwidth regions of the sub-bands 210-218 (FIG. 3B) to an associated one of a plurality of intermediate frequency modules 540.

The controller 550 controls the antenna-select switches 101 (FIG. 1) in the integrated micro-chip 530, the tunable bandpass filters 520 and the intermediate frequency modules 540 via sets of trace lines 552, 554, and 556, respectively.

The integrated micro-chip 530 receives operational signals from the communicatively coupled controller 500 via the trace line 554. The coupling of the selected portions of the broadband radio frequency signal 202 to associated radio frequency transmission lines 511 is responsive to operational signals received from the controller 550.

Each tunable bandpass filter 520 receives operational signals from the communicatively coupled controller 550 via a trace line 552 so that each radio frequency filter tunes to a selected portion of the broadband radio frequency signal 202 (FIG. 3A) responsive to the operational signals received from the controller 550.

Each intermediate frequency module 540 in the plurality of intermediate frequency modules 540 receives operational signals from the communicatively coupled controller 550 via a trace line 556.

Figure 6:
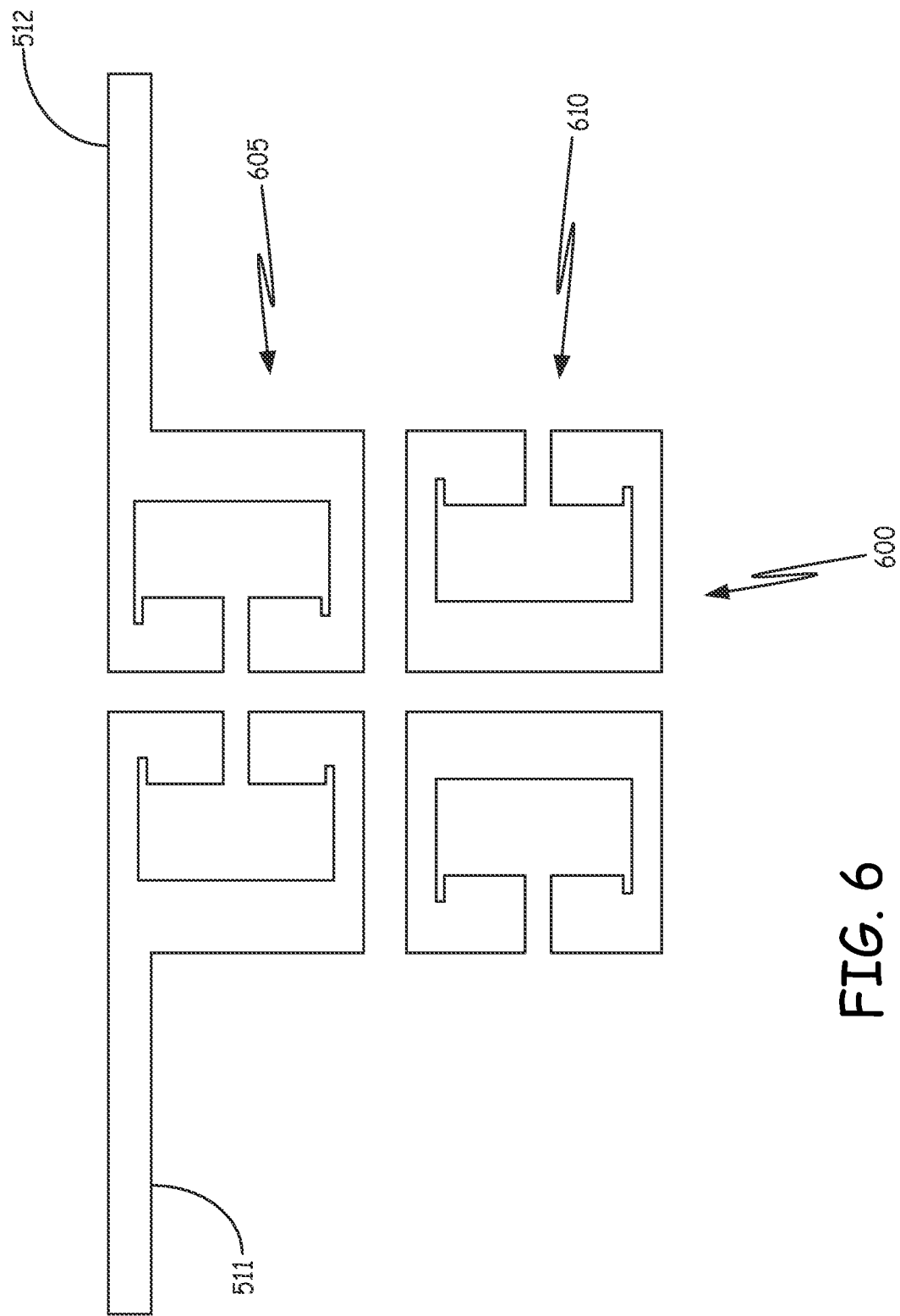
FIG. 6 is a layout of one embodiment of a tunable bandpass filter.

FIG. 6 is a layout of one embodiment of a tunable bandpass filter 600. As shown in FIG. 6 in this particular embodiment, the tunable bandpass filters are four-pole cross-coupled resonant filters 600. The four-pole cross-coupled resonant filters 600 comprises at least one upper microwave resonator 605 communicatively coupled to a radio frequency transmission line 511 at the input and radio frequency transmission line 512 at the output. The upper microwave resonator 605 is communicatively coupled to radio frequency transmission lines 511 and 512 to produce electrical coupling. The lower microwave resonator 610 produces magnetic coupling with the upper microwave resonator 605. Other forms of tunable bandpass filters 520 are possible.

Figure 7:
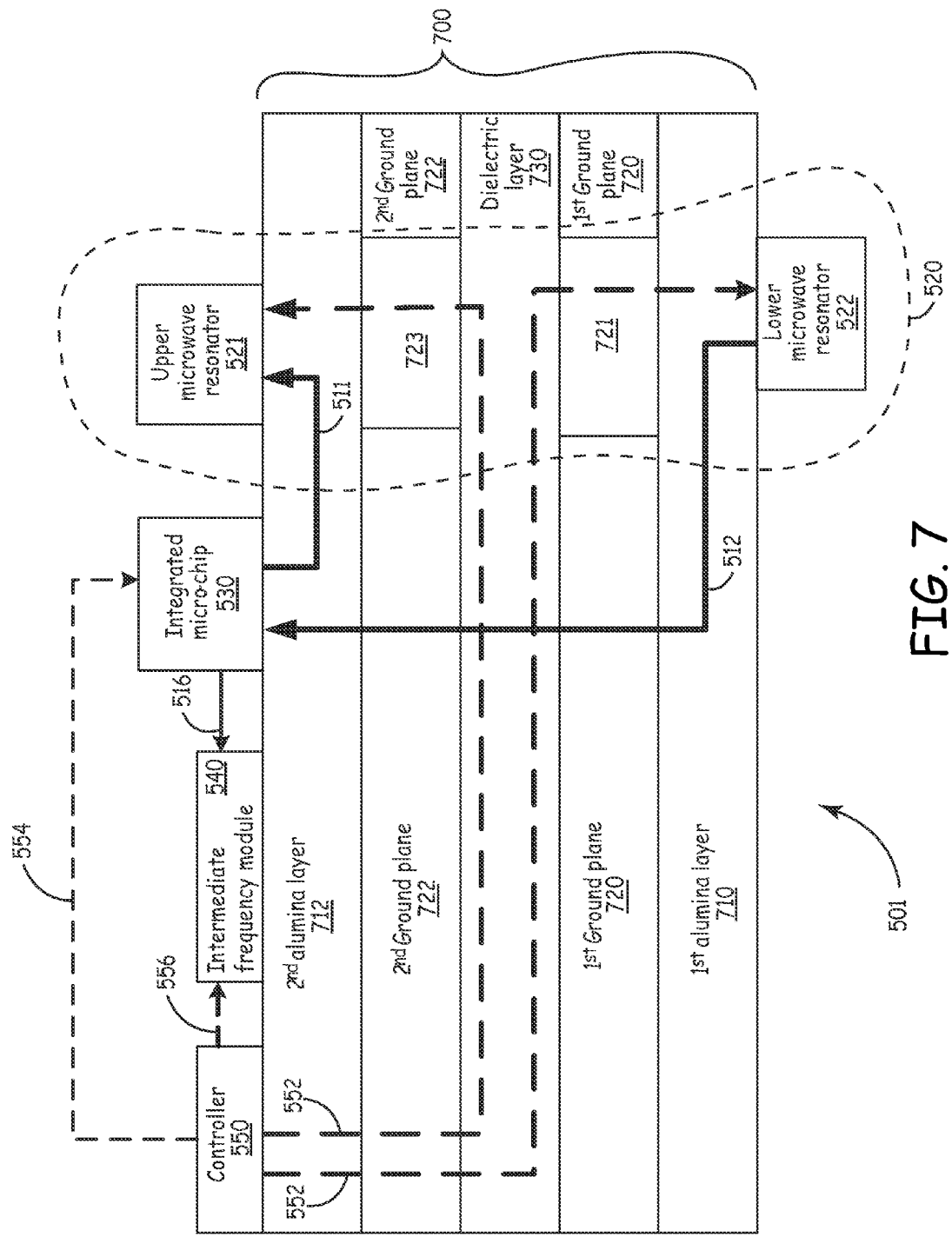
FIG. 7 is a schematic view of one embodiment of the chip carrier layers and wiring in a receiving apparatus.

FIG. 7 is a schematic view of one embodiment of the chip carrier layers and wiring in a receiving apparatus 501. In one embodiment of the implementation shown in FIG. 7, the chip carrier 570 (FIG. 5) includes one stack of layers 700 (also referred to as "stack 700") that supports trace lines 552, 554, and 556 and the radio frequency transmission lines 511, 512, and 516. In the receiving apparatus 501 the stack 700 include a first alumina layer 710, a first ground plane 720 overlaying the first alumina layer 710, a dielectric layer 730 overlaying the first ground plane 420, a second ground plane 722 overlaying the dielectric layer 730, and a second alumina layer 712 overlaying the second ground plane 722. The controller 550, the intermediate frequency modules 540, the integrated micro-chip 530 overlay the second alumina layer 712.

The first ground plane 720 includes selectively positioned holes 721. The second ground plane 722 includes selectively positioned holes 723 that are aligned to the selectively positioned holes 721 in the first ground plane 720.

As shown in FIG. 7, the tunable bandpass filter 520 comprises an upper microwave resonator 521 overlaying the second alumina layer 712 that is positioned above a lower microwave resonator 522 underlaying the first alumina layer 710. Thus, the upper microwave resonator 521 and a lower microwave resonator 522 that form a tunable bandpass filter 520 are vertically offset from each other by the stack of layers 700. The upper microwave resonator 521 and the lower microwave resonator 522 that form a tunable bandpass filter 520 are aligned to the selectively positioned hole 721 in the first ground plane 720 that is below the selectively positioned hole 723 in the second ground plane 722. In this manner, the paired upper microwave resonator 521 and the lower microwave resonator 522 are arranged to couple radio frequency electromagnetic fields to each other through the paired holes 723 and 721. In one implementation of this embodiment, at least one radio frequency transmission line 512 is positioned on at least two layers 710 and 712 of the stack 700.

Trace lines 554, 556 and 552 are shown in FIG. 7 as dashed arrows to indicate the transmission direction of the control signals. The radio frequency transmission lines 511, 512, and 516 are shown in FIG. 7 as solid arrows to indicate the transmission direction of the radio frequency signals.

The trace lines 552 that communicatively couple the controller 550 to the lower microwave resonator 522 and the upper microwave resonator 521 are represented as going through the second alumina layer 712, through the second ground layer 722, along the dielectric layer 730 and through the holes 721 and 723, respectively, and through the first alumina layer 710 and the second alumina layer 712, respectively. These paths isolate the control signals in the trace lines 552 for the lateral length of the transmission path. Other paths for the trace lines 552 are possible. The design and fabrication of trace lines through and on layers of materials is known in the art.

The radio frequency transmission line 511 extends above and/or in the second alumina layer 712 between the integrated micro-chip 530 and the upper microwave resonator 521. The radio frequency transmission line 512 extends above, through and/or in the first alumina layer 710, the ground planes 720 and 722 and the dielectric layer 730 to communicatively couple the integrated micro-chip 530 with the lower microwave resonator 522.

The intermediate frequency modules 540 and the integrated micro-chip 530 are designed to function as described above with reference to FIG. 1 and FIG. 5. The band pass filters 520 are the filters in the non-MEMS filter array 103 as described above with reference to FIG. 1 and FIG. 5.

In one implementation of this embodiment, the tunable bandpass filters are four-pole cross-coupled resonant filters 600 shown in FIG. 6. In this case, the lower microwave resonator 522 is shaped in the form of the lower microwave resonator 610 and the upper microwave resonator 521 is shaped in the form of the upper microwave resonator 605 as shown in FIG. 6. In this case, the radio frequency transmission line 512 is on the same layer as the radio frequency transmission line 511 and the lower microwave resonator is magnetically coupled.

In another implementation of this embodiment, the upper and lower microwave resonators are both overlaying the second alumina layer 712. In this case, the microwave resonators are designed to have a lateral offset from each other to minimize the crosstalk between the plurality of tunable bandpass filters on the second alumina layer 712 and the size of the receiver may be increased to reduce the crosstalk.

Figure 8:
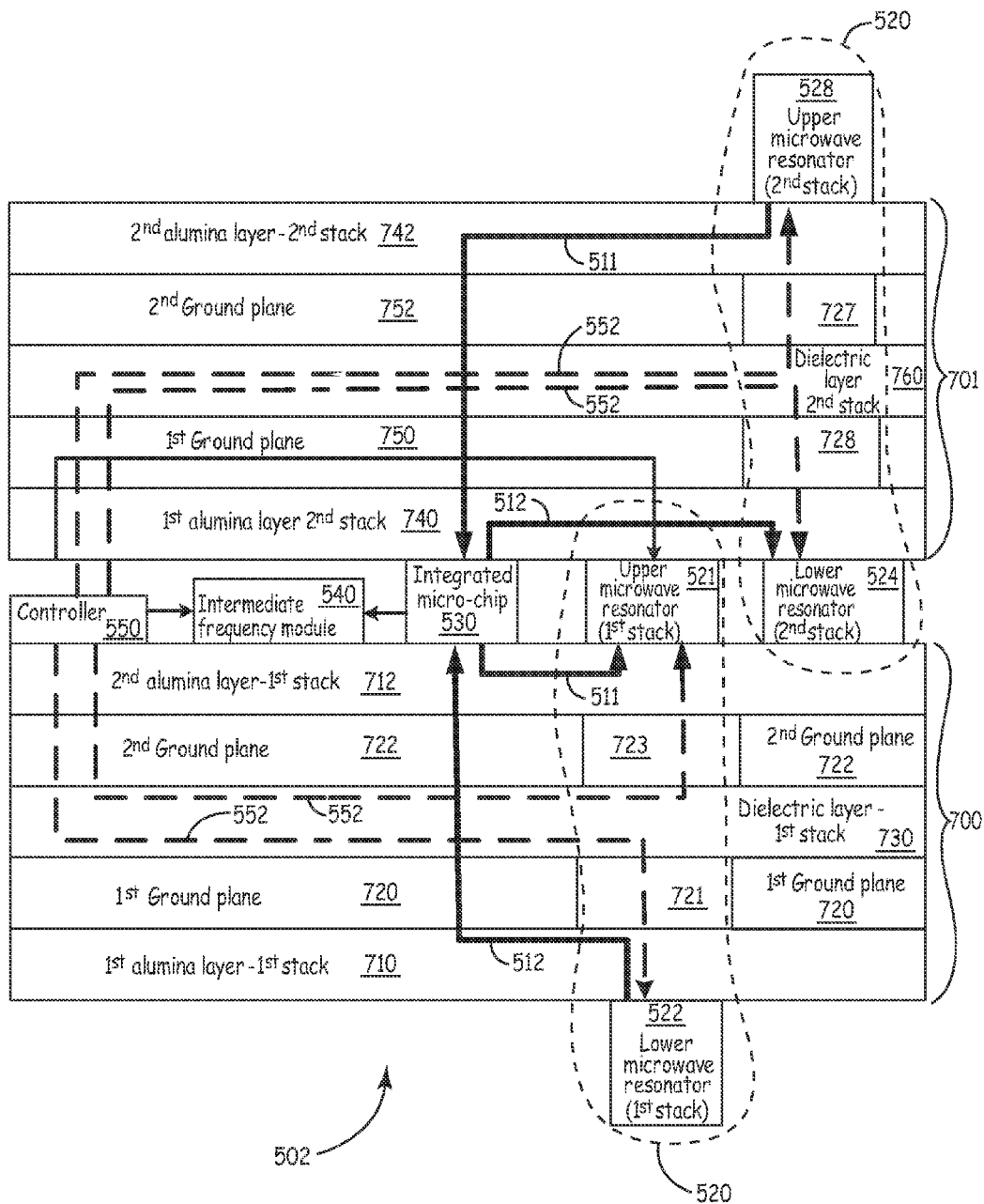
FIG. 8 is a schematic view of one embodiment of the chip carrier layers and wiring in a receiving apparatus.

FIG. 8 is a schematic view of one embodiment of the chip carrier layers and wiring on a receiving apparatus 502. In this implementation, the receiving apparatus 502 includes a plurality of stacks of layers that overlay and underlay the intermediate frequency modules 540, and the integrated micro-chip 530.

As shown in FIG. 8, the chip carrier 570 (FIG. 5) includes the stack of layers 700 and a stack of layers 701 that sandwich the controller 550, the intermediate frequency modules 540, and the integrated micro-chip 530. The stack of layers 701 (also referred to as "stack 701") overlays the stack 700, the controller 550, the intermediate frequency modules 540, and the integrated micro-chip 530. The stack of layers 701 supports additional trace lines 552, 554, and 556 and the radio frequency transmission lines 511, 512, and 516 and provides vertical offset for an upper microwave resonator 528 and a lower microwave resonator 524 that form a second tunable bandpass filter 520.

In the receiving apparatus 502, the stack 701 is similar to stack 700 and includes a first alumina layer 740, a first ground plane 750 overlaying the first alumina layer 740, a dielectric layer 760 overlaying the first ground plane 750, a second ground plane 752 overlaying the dielectric layer 760, and a second alumina layer 742 overlaying the second ground plane 752. The controller 550, the intermediate frequency modules 540, and the integrated micro-chip 530 underlay the first alumina layer 740.

The first ground plane 750 and the second ground plane 752 include respective selectively positioned holes 728 and 727 that are aligned to each other in the same manner that the selectively positioned holes 721 and 723 are aligned to each other.

As shown in FIG. 8, the upper microwave resonator 528 of the second tunable bandpass filter 520 overlays the second alumina layer 742. The upper microwave resonator 528 is positioned above a lower microwave resonator 524 underlaying the first alumina layer 740. The upper microwave resonator 528 and the lower microwave resonator 524 are aligned to the selectively positioned holes 728 and 727 as is understandable from the above description made with reference to FIG. 7.

Thus, the upper microwave resonator 528 and a lower microwave resonator 524 that form a second tunable bandpass filter 520 are vertically offset from each other by the stack of layers 700. In this manner, the paired upper microwave resonator 521 and the lower microwave resonator 522 are arranged to couple radio frequency electro-magnetic fields to each other through the paired holes 723 and 721 while the paired upper microwave resonator 528 and the lower microwave resonator 524 are arranged to couple radio frequency electro-magnetic fields to each other through the paired holes 727 and 728. The receiving apparatus 502 requires that the upper microwave resonator 521 is offset from the lower microwave resonator 524 by an amount required to prevent crosstalk between them.

The trace lines 552 in the stack 701 that communicatively couple the controller 550 to the lower microwave resonator 524 and the upper microwave resonator 528 configured in a manner similar to the configuration of the trace lines 552 in the stack 700 as is understandable from the above description made with reference to FIG. 7. Likewise, the radio frequency transmission lines 511 and 512 in stack 701 are configured in a manner similar to the configuration of the radio frequency transmission lines 511 and 512 in the stack 700 as is understandable from the above description made with reference to FIG. 7. In one implementation of this embodiment, at least one radio frequency transmission line 511 is positioned on at least two layers 740 and 742 of the stack 701.

In one implementation of this embodiment, the tunable bandpass filters in the receiving apparatus 502 are four-pole cross-coupled resonant filters 600 shown in FIG. 6. In one such embodiment, the lower microwave resonator 524 is shaped in the form of the upper microwave resonator 605 and the upper microwave resonator 528 is shaped in the form of the lower microwave resonator 610 as shown in FIG. 6. In this case, the radio frequency transmission line 511 is on the same layer as the radio frequency transmission line 512 and the upper microwave resonator 528 is magnetically coupled.

In another such embodiment, the lower microwave resonator 524 is shaped in the form of the lower microwave resonator 610 and the upper microwave resonator 528 is shaped in the form of the upper microwave resonator 605 as shown in FIG. 6. In this case, the radio frequency transmission line 512 is on the same layer as the radio frequency transmission line 511 and the lower microwave resonator 524 is magnetically coupled.

In one implementation of this embodiment, the upper and lower microwave resonators for the stack 700 are both overlaying the second alumina layer 712 and the upper and lower microwave resonators for the stack 701 are both overlaying the second alumina layer 742. In this case, the microwave resonators on the same alumina layer 712 or 742 are designed to have a lateral offset from each other to minimize the crosstalk between the plurality of tunable bandpass filters. The vertical offset between the tunable bandpass filter 520 on the stack 700 and the tunable bandpass filter 520 on the stack 701 provide a smaller size package for the receiving apparatus 502.

In yet another implementation of this embodiment, there are two or more stacks, such as stack 701, above the integrated micro-chip 530 and two or more stacks, such as stack 700 below the integrated micro-chip 530, so that the integrated micro-chip 530 and the controller are sandwiched between more than two stacks. In yet another implementation of this embodiment, there are two or more stacks, such as stack 701, above the integrated micro-chip 530 or two or more stacks, such as stack 700, below the integrated micro-chip 530, so that the integrated micro-chip 530 and the controller are above or more than two stacks.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system to receive using micro-electromechanical systems (MEMS) elements, the system comprising:
   means for receiving a broadband signal;
   means for selecting a superband of frequencies from a plurality of superbands of frequencies in the received broadband signal;

means for selecting a plurality of bands within a selected one of the superband of frequencies, wherein the plurality of bands each have a center frequency that is offset from the other center frequencies;

means for steering output from the means for selecting the plurality of bands to one of a plurality of modules; and means for receiving the output from the means for steering the output at the one of the plurality of modules.

2. A method of receiving, the method comprising:

receiving a broadband signal at a means for receiving;

selecting a superband of frequencies from a plurality of superbands of frequencies in the received broadband signal at a means for selecting the superband;

selecting a plurality of bands within a selected one of the superband of frequencies at a means for selecting the plurality of bands, wherein the plurality of bands each have a center frequency that is offset from other center frequencies; and steering output from micro-electromechanical systems (MEMS) elements to one of a plurality of modules at a means for steering the output.

3. The method of claim 2, further comprising receiving the output at a radio on a chip in the one of the plurality of modules from the MEMS elements.

4. The method of claim 2, further comprising:

steering the selected superband of frequencies via a filter bank operable to select a band from the plurality of bands within the selected superband of frequencies.

5. The method of claim 4, wherein selecting the plurality of bands within the selected one of the superband of frequencies comprises selecting the band from one of the plurality of bands within the selected superband of frequencies at the one of the micro-electromechanical systems (MEMS) elements.

6. The method of claim 5, wherein steering the output from the micro-electromechanical systems (MEMS) elements to one of the plurality of modules comprises steering the selected band from the MEMS element to one of the plurality of modules.

7. The system of claim 1, further comprising:

means for steering the selected superband of frequencies to the means for selecting the plurality of bands within the superband of frequencies.

8. The system of claim 7, wherein the means for selecting the plurality of bands within the superband of frequencies comprises means for selecting a band from the plurality of bands within the selected superband of frequencies.

9. The system of claim 8, wherein the means for steering the output comprises means for steering the selected band.

10. The system of claim 9, wherein the means for receiving the output from the means for steering the output at the one of the plurality of modules comprises means for receiving the selected band from the means for steering the selected band at the one of the plurality of modules.

\* \* \* \* \*